United States Patent
Voldman

(10) Patent No.: US 7,800,184 B2
(45) Date of Patent: Sep. 21, 2010

(54) INTEGRATED CIRCUIT STRUCTURES WITH SILICON GERMANIUM FILM INCORPORATED AS LOCAL INTERCONNECT AND/OR CONTACT

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 11/275,481

(22) Filed: Jan. 9, 2006

(65) Prior Publication Data

US 2007/0181972 A1 Aug. 9, 2007

(51) Int. Cl.
*H01L 29/06* (2006.01)

(52) U.S. Cl. ............... 257/377; 257/616; 257/E23.141; 257/E23.168; 257/E23.169; 257/E23.17; 257/E23.175; 257/E21.575; 257/E21.627; 257/E21.641

(58) Field of Classification Search .................. 257/377, 257/E23.141, E23.168, E23.169, E23.17, 257/E23.175, E21.575, 616, E21.627, E21.641
See application file for complete search history.

(56) References Cited

U.S. PATENT DOCUMENTS

| | | | |
|---|---|---|---|
| 4,672,416 A | 6/1987 | Nakazato et al. | |
| 4,933,739 A | 6/1990 | Harari | |
| 5,156,994 A | 10/1992 | Moslehi | |
| 5,563,440 A | 10/1996 | Yamazaki et al. | |
| 6,091,129 A | 7/2000 | Cleeves | |
| 6,469,388 B1 | 10/2002 | Thakur | |
| 6,864,544 B2 * | 3/2005 | Hokazono | 257/377 |
| 6,872,620 B2 | 3/2005 | Chidambarrao et al. | |
| 6,879,044 B2 | 4/2005 | Thakur | |
| 6,949,482 B2 | 9/2005 | Murthy et al. | |
| 2004/0063293 A1 * | 4/2004 | Greenberg et al. | 438/312 |
| 2004/0076071 A1 | 4/2004 | Liaw | |
| 2004/0173834 A1 | 9/2004 | Wang | |
| 2004/0235229 A1 * | 11/2004 | Hokazono | 438/199 |
| 2005/0111251 A1 | 5/2005 | Liaw | |
| 2005/0180199 A1 | 8/2005 | Liaw | |

OTHER PUBLICATIONS

H. Jorg Osten, "MBE growth and properties of supersaturated, carbon-containing silicon/germanium alloys on Si(001)", Thin Solid Films 367 (2000) pp. 101-111.*
Mukherjee, et al., "The Soft Error Problem: An Architectural Perspective," 5 pages.

* cited by examiner

*Primary Examiner*—Kenneth A Parker
*Assistant Examiner*—Jay C Kim
(74) *Attorney, Agent, or Firm*—Gibb I.P. Law Firm, LLC; Richard M. Kotulak, Esq.

(57) ABSTRACT

Disclosed are integrated circuit structures each having a silicon germanium film incorporated as a local interconnect and/or an electrical contact. These integrated circuit structures provide improved local interconnects between devices and/or increased capacitance to devices without significantly increasing structure surface area or power requirements. Specifically, disclosed are integrated circuit structures that incorporate a silicon germanium film as one or more of the following features: as a local interconnect between devices; as an electrical contact to a device (e.g., a deep trench capacitor, a source/drain region of a transistor, etc.); as both an electrical contact to a deep trench capacitor and a local interconnect between the deep trench capacitor and another device; and as both an electrical contact to a deep trench capacitor and as a local interconnect between the deep trench capacitor and other devices.

9 Claims, 6 Drawing Sheets

INTEGRATED CIRCUIT STRUCTURES WITH SILICON GERMANIUM FILM INCORPORATED AS LOCAL INTERCONNECT AND/OR CONTACT

BACKGROUND OF THE INVENTION

1. Field of the Invention

The invention generally relates to integrated circuit structures and, more particularly, to integrated circuit structures that incorporate a silicon germanium film as an electrical contact and/or as a local interconnect between devices.

2. Description of the Related Art

It is often necessary to locally connect two or more devices below the wiring levels of an integrated circuit (i.e., to provide local interconnects between devices within an integrated circuit). However, depending upon the technology and process flows used current methods of forming such local interconnects can be inefficient. Therefore, there is a need in the art for an improved local interconnect structure that can be used to connect two or more devices within an integrated circuit.

Additionally, solid-state circuits, including memory devices and flip-flops, are susceptible to upset by ionizing radiation, noise and other sources. These upsets are known as soft errors because information is lost but the circuit is not damaged. Thus, soft errors reflect system reliability as opposed to permanent system failure. For example, in a static random access memory (SRAM) cell, source and diffusion nodes can accumulate charges from the surrounding environment (e.g., the packaging environment). Once a sufficient amount of charge is accumulated the state of the logic may flip at an undesired point in time causing a logical fault. The minimum charge required to flip the cell is referred to as the Qcrit and depends on the cell capacitance and supply voltage. As discussed in the recent article by Mukherjee et al. "The Soft Error Problem: An Architectural Perspective," *hpca*, pp. 243-247, 11th International Symposium on High-Performance Computer Architecture (HPCA'05), 2005, techniques that have been used to reduce the soft error rate (SER) of SRAM cells have included increasing the cell capacitance and/or the supply voltage and creating radiation-hardened (rad-hard) cells. However, the SER of current state-of-the-art SRAM cells remains a concern due to significant area and power penalties associated with increasing capacitance in such rad-hard SRAM cells. Therefore, there is a need for an improved capacitor structure that can provide increased capacitance to devices, such as rad-hard SRAM cells, without significantly increasing area or power requirements.

SUMMARY OF THE INVENTION

In view of the foregoing, embodiments of the invention provide integrated circuit structures each having a silicon germanium film incorporated as a local interconnect and/or a capacitor contact. These integrated circuit structures provide improved local interconnects between devices and/or increased capacitance to devices without significantly increasing structure surface area or power requirements. Specifically, embodiments of the invention provide integrated circuit structures that incorporate a silicon germanium film as (1) a local interconnect between devices, (2) an electrical contact to a deep trench capacitor, (3) both an electrical contact to a deep trench capacitor and as a local interconnect between the deep trench capacitor and another device (e.g., between the deep trench capacitor and the drain of a transistor to form a DRAM cell), and (4) both an electrical contact to a deep trench capacitor and as a local interconnect between the deep trench capacitor and other devices (e.g., between the deep trench capacitor and multiple transistors in an SRAM cell).

One embodiment of the integrated circuit structure of the invention incorporates a silicon germanium film as a local interconnect between two devices separated by an isolation structure. Specifically, this integrated circuit structure comprises a substrate and a semiconductor layer (e.g., a single crystalline silicon layer) above the substrate. Integrated circuit devices (e.g., a first device and a second device) are formed from the semiconductor layer. These devices can be the same or different types of devices and can include devices such as, complementary metal oxide semiconductor devices, transistors, bipolar transistors, resistors, capacitors, diodes, etc. For example, the first and second devices can comprise a p-type pull-up field effect transistor (pull-up pFET) and an n-type pass-gate field effect transistor (pass-gate nFET), respectively, of one node of a six transistor static random access memory cell (6T SRAM cell). Regardless of the type of device, the first device comprises a first diffusion region within the semiconductor layer and positioned adjacent to the top surface of the semiconductor layer. The first diffusion region can comprise a single crystalline region that is heavily doped with a first conductivity type dopant (e.g., a p+ diffusion region). Similarly, the second device comprises a second diffusion region within the semiconductor layer and positioned adjacent to the top surface of the semiconductor layer. The second diffusion region can comprise a single crystalline region that is heavily doped with a second conductivity type dopant (e.g., an n+ diffusion region).

This integrated circuit structure also comprises an isolation structure (e.g., a shallow trench isolation (STI) structure, a recessed oxide isolation (ROX) structure, a local oxidation of silicon structure (LOCOS), etc.). The isolation structure is between the first and second diffusion regions also at the top surface of the semiconductor layer.

The silicon germanium film is above the semiconductor layer and can be electrically connected to a power supply by an electrode. The film extends from above the first diffusion region over the isolation structure to above the second diffusion region so as to electrically connect the first diffusion region and thus, the first device, to the second diffusion region and thus, the second device.

Furthermore, first portions of the silicon germanium film that are located above the first and second diffusion regions comprise single crystalline silicon germanium. A second portion of the silicon germanium film above the isolation structure comprises amorphous or polycrystalline silicon germanium. Depending upon the processing and etching used to shape the upper corners of the isolation structure, the silicon germanium film can be formed such that the boundaries between the first portions and the second portion project from the upper corners of the isolation structure at a predetermined angle (e.g., from a 45 to a 135 degree angle from the top surface of the semiconductor layer). Additionally, due to the methods that may be used to form this film (e.g., ultra-high vacuum chemical vapor deposition), different areas of the silicon germanium film can comprise different concentrations of germanium. The silicon germanium film may also be doped with carbon such that it comprises a silicon germanium carbon film (e.g., to prevent or limit boron diffusion from a p+ diffusion region to an n+ diffusion region).

Another embodiment of the integrated circuit structure of the invention comprises a deep trench capacitor that incorporates a silicon germanium film as an electrical contact. This capacitor comprises an isolation structure (e.g., a shallow trench isolation (STI) structure, a recessed oxide isolation (ROX) structure, a local oxidation of silicon structure (LO-COS), etc.). This isolation structure has a first side and a second side. The silicon germanium film is positioned adjacent to the first side of the isolation structure (i.e., above the isolation structure) and a deep trench (DT) isolation structure is positioned adjacent to the second side of the isolation structure (i.e., below the isolation structure).

The DT structure comprises a dielectric liner and a first fill material (e.g., a semiconductive or conductive material). A channel extends through the isolation structure from the first side to the second side and comprises a second fill material (e.g., a second semiconductive or conductive material) that electrically connects the silicon germanium film to the first fill material. The silicon germanium film can be electrically connected to a power supply by an electrode. This allows a voltage to be applied to the first fill material and, thus, allows biasing of the capacitor. Such a deep trench capacitor can be incorporated into an SRAM cell between a n-type pass-gate transistor and a p-type pull-up transistor in order to increase capacitance and thereby minimize the soft error rate of the SRAM cell.

Furthermore, the silicon germanium film can comprise amorphous or polycrystalline silicon germanium. Additionally, due to the methods that may be used to form this film (e.g., ultra-high vacuum chemical vapor deposition), different areas of the silicon germanium film can comprise different concentrations of germanium. For example, the concentration of germanium may be greater at the top surface of the film than it is at the bottom surface of the film or vice versa. Alternatively, the concentration of germanium may be greater in one corner of the film than another. The silicon germanium film may also be doped with carbon such that is comprises a silicon germanium carbon film (e.g., to prevent or limit boron diffusion from a p+ diffusion region).

Another embodiment of the integrated circuit structure of the invention incorporates a silicon germanium film as both an electrical contact to a deep trench capacitor and as a local interconnect between the deep trench capacitor and another device (e.g., between the deep trench capacitor and the drain of a transistor to form a DRAM cell). Specifically, this integrated circuit structure comprises a substrate and a semiconductor layer (e.g., a single crystalline silicon layer) above the substrate. An integrated circuit device (e.g., complementary metal oxide semiconductor device, a transistor, a bipolar transistor, a resistor, a capacitor, a diode, etc.) is formed from the semiconductor layer. This device specifically comprises a diffusion region that is within the semiconductor layer and adjacent to the top surface of the semiconductor layer. The diffusion region can comprise a single crystalline region that is heavily doped with a first or second conductivity type dopant, depending upon the type of device (e.g., a p+ diffusion region for a pFET or an n+ diffusion region for an nFET).

This integrated circuit structure can further comprise a deep trench capacitor, similar to the deep trench capacitor described above, that is positioned adjacent to the diffusion region. The capacitor comprises an isolation structure (e.g., a shallow trench isolation (STI) structure, a recessed oxide isolation (ROX) structure, a local oxidation of silicon structure (LOCOS), etc.). The isolation structure has a first side at the top surface of the semiconductor layer and a second (opposing) side. A silicon germanium film is positioned adjacent to the first side of the isolation structure (i.e., above the isolation structure) and a deep trench isolation (DT) structure is positioned adjacent to the second side of the isolation structure (i.e., below the isolation structure). The DT structure comprises a dielectric liner and a first fill material (e.g., a semiconductive or conductive material). A channel extends through the isolation structure from the first side to the second side and comprises a second fill material (e.g., a second semiconductive or conductive material) that electrically connects the silicon germanium film to the first fill material. The silicon germanium film can be electrically connected to a power supply by an electrode. This allows a voltage to be applied to the first fill material and, thus, allows biasing of the capacitor.

For this integrated circuit structure, the silicon germanium film extends further over the diffusion region of the device so as to electrically connect the diffusion region and thus, the device, to the capacitor. For example, if the device comprises a transistor and this diffusion region comprises a drain region of the transistor, then the silicon germanium film connects the two devices (transistor and capacitor) such that the integrated circuit structure comprises a dynamic random access memory (SRAM) cell.

Furthermore, a first portion of the silicon germanium film that is located above the diffusion region comprises single crystalline silicon germanium. A second portion of the silicon germanium film above the isolation structure comprises amorphous or polycrystalline silicon germanium. Depending upon the processing and etching used to shape the upper corners of the isolation structure, the silicon germanium film can be formed such that the boundary between the first portion and the second portion projects from the upper corner of the isolation structure at a predetermined angle (e.g., from a 45 to a 135 degree angle from the top surface of the semiconductor layer). Additionally, due to the methods that may be used to form this film (e.g., ultra-high vacuum chemical vapor deposition), different areas of the silicon germanium film can comprise different concentrations of germanium. The silicon germanium film may also be doped with carbon such that is comprises a silicon germanium carbon film (e.g., to prevent or limit boron diffusion from a p+ diffusion region).

Lastly, another embodiment of the integrated circuit structure of the invention incorporates a silicon germanium film as both an electrical contact to a deep trench capacitor and as a local interconnect between the deep trench capacitor and other devices (e.g., between the deep trench capacitor and multiple transistors in an SRAM cell). Specifically, this integrated circuit structure comprises a substrate and a semiconductor layer (e.g., a single crystalline silicon layer) above the substrate. Integrated circuit devices (e.g., a first device and a second device) are formed from the semiconductor layer. These devices can be the same or different types of devices and can include devices such as, complementary metal oxide semiconductor devices, transistors, bipolar transistors, resistors, capacitors, diodes, etc. For example, the first and second devices can comprise a p-type pull-up field effect transistor (pull-up pFET) and an n-type pass-gate field effect transistor (pass-gate NFET), respectively, of one node of a six transistor static random access memory cell (6T SRAM cell). Regardless of the type of device, the first device comprises a first diffusion region that is positioned within and at the top surface of the semiconductor layer. The first diffusion region can comprise a single crystalline region that is heavily doped with a first conductivity type dopant (e.g., a p+ diffusion region). Similarly, the second device comprises a second diffusion region that is positioned within and at the top surface of the semiconductor layer. The second diffusion region can comprise a single crystalline region that is heavily doped with a second conductivity type dopant (e.g., an n+ diffusion region).

This integrated circuit structure can further comprise a deep trench capacitor, similar to the deep trench capacitors described above, between the first diffusion region and the second diffusion region. The capacitor comprises an isolation structure (e.g., a shallow trench isolation (STI) structure, a recessed oxide isolation (ROX) structure, a local oxidation of silicon structure (LOCOS), etc.). The isolation structure has a first side at the top surface of the semiconductor layer and a second (opposing) side. A silicon germanium film is positioned adjacent to the first side of the isolation structure (i.e., above the isolation structure) and a deep trench (DT) isolation structure is positioned adjacent to the second side of the isolation structure (i.e., below the isolation structure). The DT structure comprises a dielectric liner and a first fill material (e.g., a semiconductive or conductive material). A channel extends through the isolation structure from the first side to the second side and comprises a second fill material (e.g., a second semiconductive or conductive material) that electrically connects the silicon germanium film to the first fill material. The silicon germanium film can be electrically connected to a power supply by an electrode. This allows a voltage to be applied to the first fill material and, thus, allows biasing of the capacitor.

For this integrated circuit structure, the silicon germanium film further extends over from over the first diffusion region across the isolation structure of the capacitor to over the second diffusion region so as to electrically connect the first diffusion region, the capacitor and the second diffusion region. For example, if the first device is a p-type pull-up transistor of a static random access memory cell and the second device is an n-type pass-gate transistor of the same node in the same static random access memory cell, by applying a voltage to the silicon germanium film (e.g., via the electrode) the capacitor between the transistors can be biased so to minimize the soft error rate of the static random access memory cell.

Furthermore, first portions of the silicon germanium film that are located above the first and second diffusion regions comprise single crystalline silicon germanium. A second portion of the silicon germanium film above the isolation structure comprises amorphous or polycrystalline silicon germanium. Depending upon the processing and etching used to shape the upper corners of the isolation structure, the silicon germanium film can be formed such that the boundaries between the first portions and the second portion project from the upper corners of the isolation structure at a predetermined angle (e.g., from a 45 to a 135 degree angle from the top surface of the semiconductor layer). Additionally, due to the methods that may be used to form this film (e.g., ultra-high vacuum chemical vapor deposition), different areas of the silicon germanium film can comprise different concentrations of germanium. The silicon germanium film may also be doped with carbon such that it comprises a silicon germanium carbon film (e.g., to prevent or limit boron diffusion from a p+ diffusion region to an n+ diffusion region).

These and other aspects of the embodiments of the invention will be better appreciated and understood when considered in conjunction with the following description and the accompanying drawings. It should be understood, however, that the following descriptions, while indicating exemplary embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS OF THE INVENTION

Figure 1:
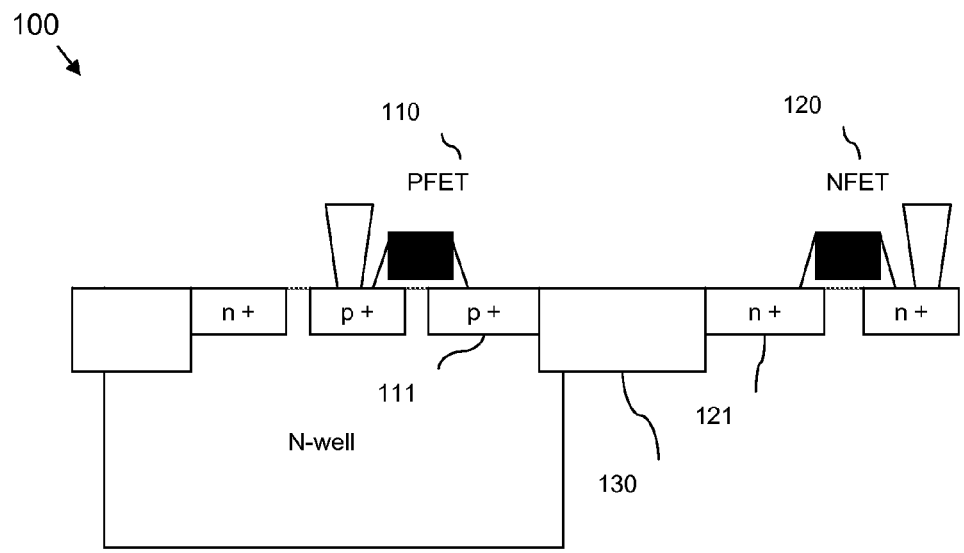
FIG. 1 is a schematic block diagram illustrating a cross-sectional view of a static random access memory cell (SRAM) cell.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for an improved local interconnect structure that can be used to connect two or more devices within an integrated circuit structure as well as a need for an improved capacitor structure that can provide increased capacitance to devices, such as radiation hardened (rad-hard) static random access memory (SRAM) cells, without significantly increasing area or power requirements. In view of the foregoing, embodiments of the invention provide integrated circuit structures that incorporate a silicon germanium film for the following features: (1) as a local interconnect between devices, (2) as an electrical contact to a deep trench capacitor, (3) as both an electrical contact to a deep trench capacitor and a local interconnect between the deep trench capacitor and another device (e.g., between the deep trench capacitor and the drain of a transistor to form a DRAM cell), and (4) as both an electrical contact to a deep trench capacitor and as a local interconnect between the deep trench capacitor and other devices (e.g., between the deep trench capacitor and multiple transistors in an SRAM cell).

Generally, a six-transistor SRAM cell comprises two complementary connected nodes. Each node comprises a pass-gate (n-type) transistor, a pull-up (p-type) transistor and a pull-down (n-type) transistor. In operation because each node is tied to the gate of the pull-up transistor of the other node, the values stored in each node remain complementary. FIG. 1 illustrates a cross-sectional view of a pull-up transistor 110 and pass-gate transistor 120 of a node of a conventional 6-transistor SRAM cell. The p+ and n+ source/drain (S/D) diffusion regions 111, 121, respectively, of the pull-up and pass-gate transistors 110, 120 are separated by an isolation structure 130 (e.g., a shallow trench isolation (STI) structure (as shown). Conventionally, the electrical connection made between these two transistors 110, 120 is via one of the metal wiring level. However, as mentioned above, there is a need in the art for an improved local interconnect structure that can be used to connect two or more devices within an integrated circuit (e.g., two transistors within an SRAM cell) below the wiring levels.

Figure 2:
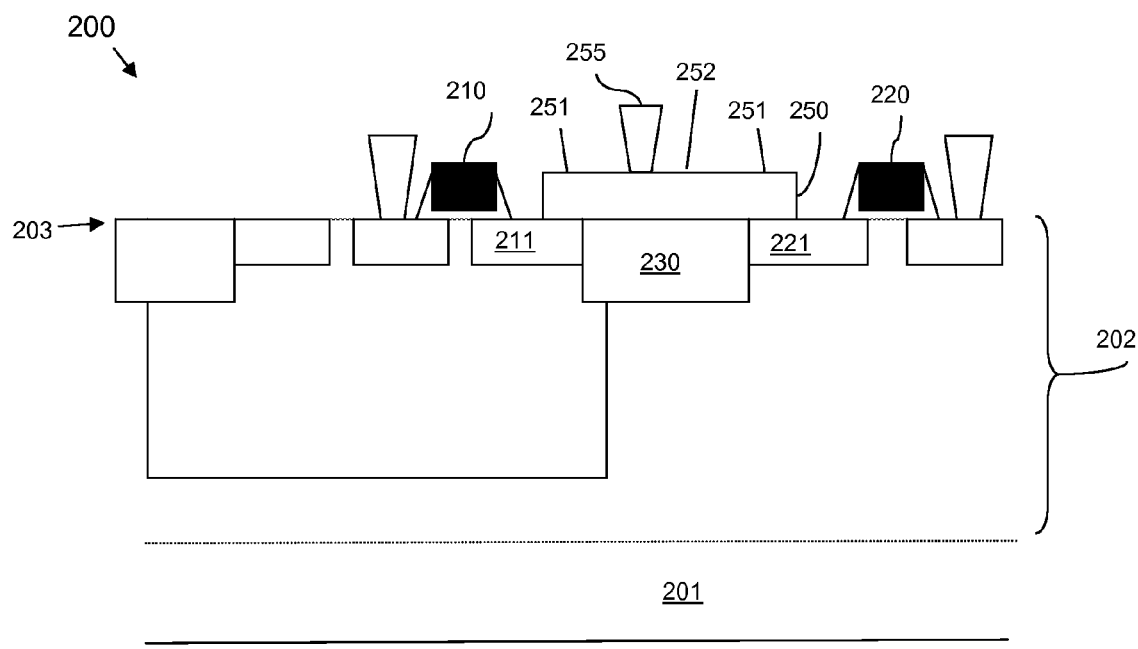
FIG. 2 is a schematic block diagram illustrating a cross-sectional view of an exemplary integrated circuit structure of one embodiment of the invention.

FIG. 2 illustrates one embodiment of the integrated circuit structure 200 of the invention that incorporates a silicon germanium film 250 as a local interconnect between two devices 210, 220 separated by an isolation structure 230. Specifically, this integrated circuit structure 200 comprises a substrate 201 and a semiconductor layer 202 (e.g., a single crystalline silicon layer) above the substrate 201. Integrated circuit devices (e.g., a first device 210 and a second device 220) are formed the semiconductor layer 202. These devices 210, 220 can be the same or different types of devices and can include devices such as, complementary metal oxide semiconductor devices, transistors, bipolar transistors, resistors, capacitors, diodes, etc. For example, the first and second devices 210, 220 can comprise a p-type pull-up field effect transistor (pull-up pFET) and an n-type pass-gate field effect transistor (pass-gate nFET), respectively, of one node of a six transistor static random access memory cell (6T SRAM cell). Regardless of the type of device, the first device 210 comprises a first diffusion region 211 within the semiconductor layer 202 and positioned adjacent to the top surface 203 of the semiconductor layer 202. The first diffusion region 211 can comprise a single crystalline region that is heavily doped with a first conductivity type dopant (e.g., a p+ diffusion region). Similarly, the second device 220 comprises a second diffusion region 221 within the semiconductor layer 202 and positioned adjacent to the top surface 203 of the semiconductor layer 202. The second diffusion region 221 can comprise a single crystalline region that is heavily doped with a second conductivity type dopant (e.g., an n+ diffusion region).

This integrated circuit structure 200 also comprises an isolation structure 230 (e.g., a shallow trench isolation (STI) structure, a recessed oxide isolation (ROX) structure, a local oxidation of silicon structure (LOCOS), etc.). The isolation structure 230 is between the first and second diffusion regions 210, 230 also at the top surface 203 of the semiconductor layer 202.

The silicon germanium film 250 is above the semiconductor layer 202 and can be electrically connected to a power supply by an electrode 255. The film 250 extends from above the first diffusion region 211 over the isolation structure 230 to above the second diffusion region 221 so as to electrically connect the first diffusion region 211 and thus, the first device 210, to the second diffusion region 221 and thus, the second device 220.

Figure 3A:
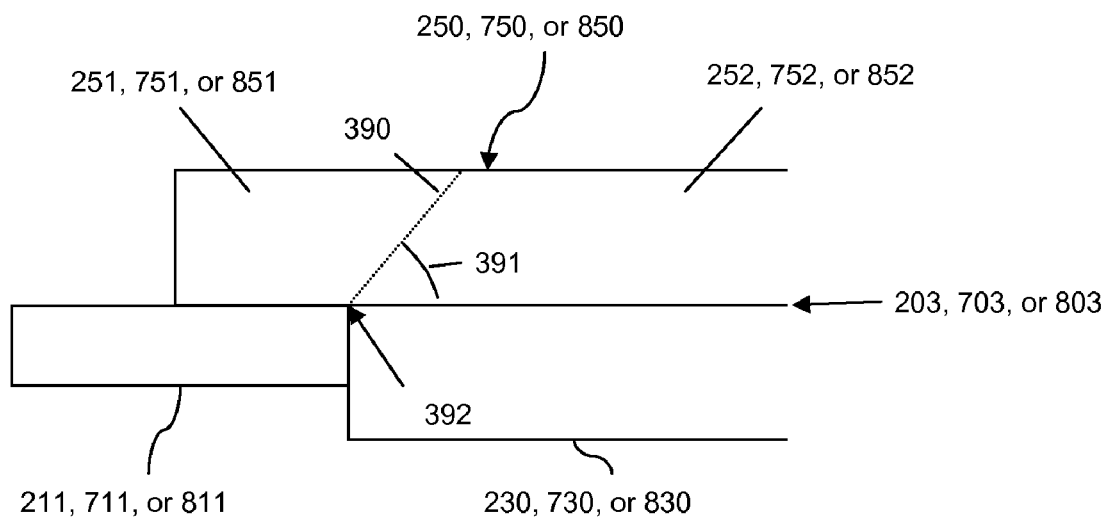
FIGS. 3a-b are schematic diagrams illustrating exemplary facet angles that define the single crystalline/polycrystalline boundaries within a silicon germanium film.
Figure 3B:
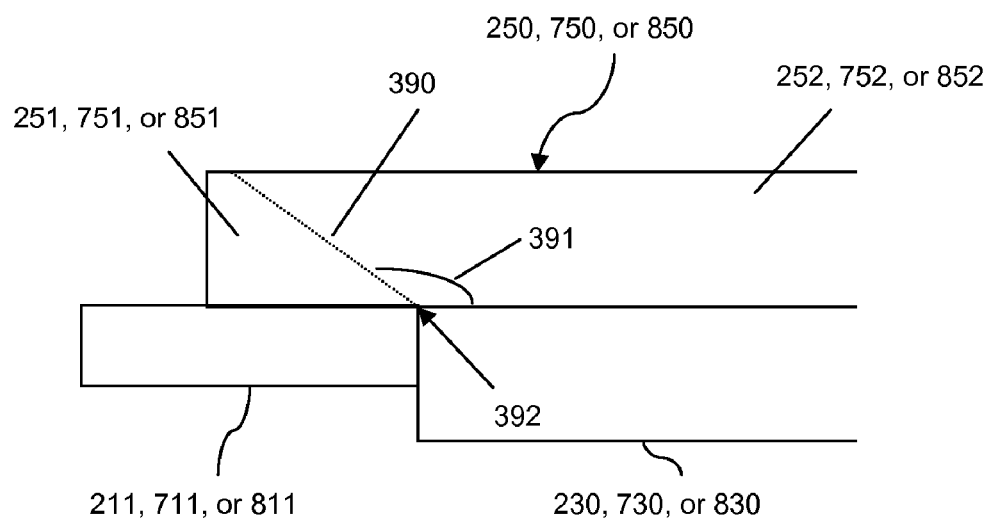
Figure 4A:
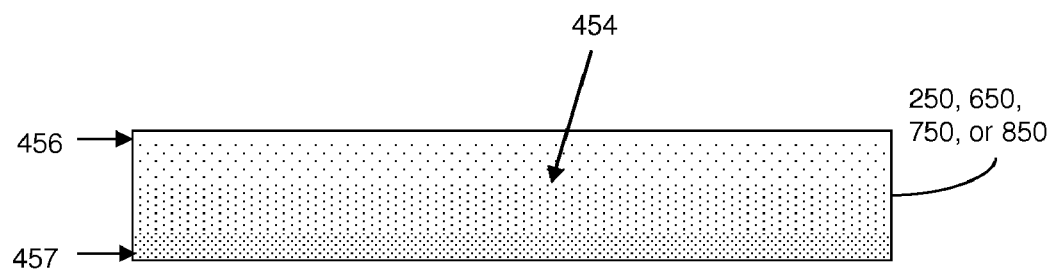
FIGS. 4a-d are schematic diagrams illustrating germanium concentration variation across a silicon germanium film.
Figure 4B:
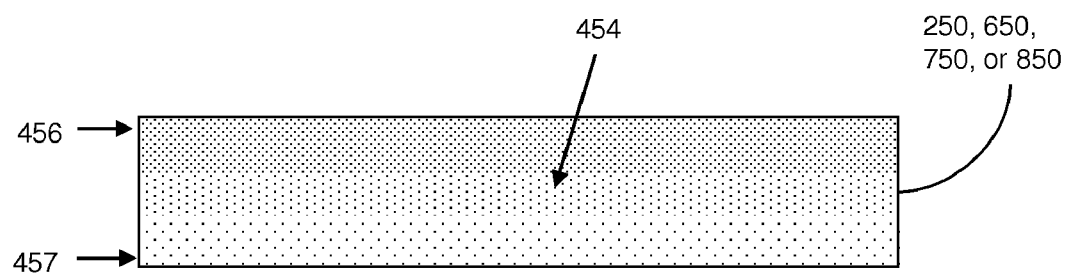
Figure 4C:
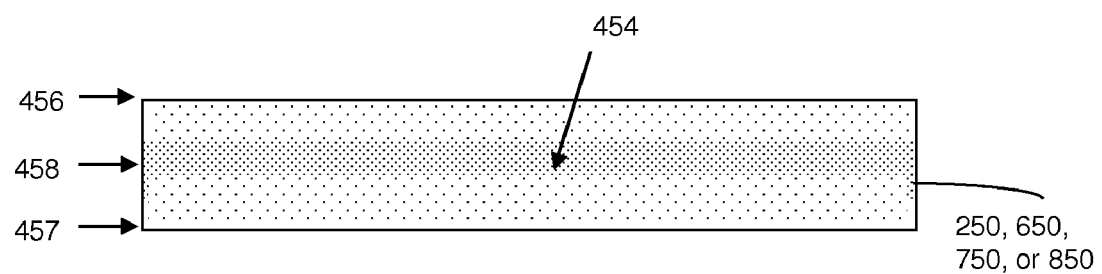
Figure 4D:
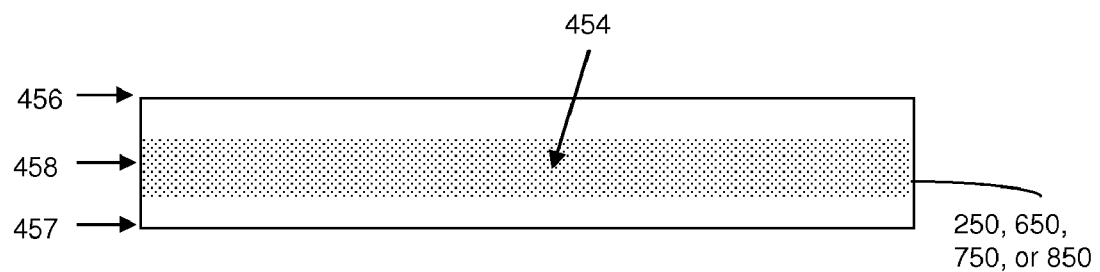

Furthermore, first portions 251 of the silicon germanium film 250 that are located above the first and second diffusion regions 211, 221 comprise single crystalline silicon germanium. A second portion 252 of the silicon germanium film 250 above the isolation structure 230 comprises amorphous or polycrystalline silicon germanium. Referring to FIGS. 3a-b, depending upon the processing and etching used to shape the upper corners 392 of the isolation structure 230 at the triple point intersections between the diffusion regions 211, 221, the silicon germanium film 250 and the isolation structure 230, the silicon germanium film 250 can be formed such that the boundaries 390 (i.e., the facets, transitional areas, etc.) between the first portions 251 and the second portion 252 project from the upper corners 392 of the isolation structure 230 at a predetermined angle 391 (e.g., from a 45, as illustrated in FIG. 3a, to a 135 degree angle, as illustrated in FIG. 3b) from the top surface 203 of the semiconductor layer 202. Additionally, due to the methods that may be used to form this film (e.g., ultra-high vacuum chemical vapor deposition), different areas of the silicon germanium film 250 can comprise different concentrations of germanium 454 (see FIGS. 4a-d). For example, as illustrated in FIGS. 4a and 4b the concentration of germanium 454 may be triangular (i.e., greater at the top surface 456 of the film 250 than it is at the bottom surface 457 or vice versa). Alternatively, the concentration of germanium 454 may be trapezoidal or square (i.e., with a greater concentration in the center 458 of the film and a lesser concentration of germanium (as illustrated in FIG. 4c) or no germanium (as illustrated in FIG. 4d) at the top and bottom surfaces 456, 457 of the film). Those skilled in the art will recognize that the shapes of the germanium concentrations in the silicon germanium film 250 of FIGS. 4a-d are offered for illustration purposes only and that other shapes are possible and anticipated. The silicon germanium film 250 may also be doped with carbon such that it comprises a silicon germanium carbon film (e.g., to prevent or limit boron diffusion from a p+ diffusion region (e.g., 211) to an n+ diffusion region (e.g., 221)).

Figure 5:
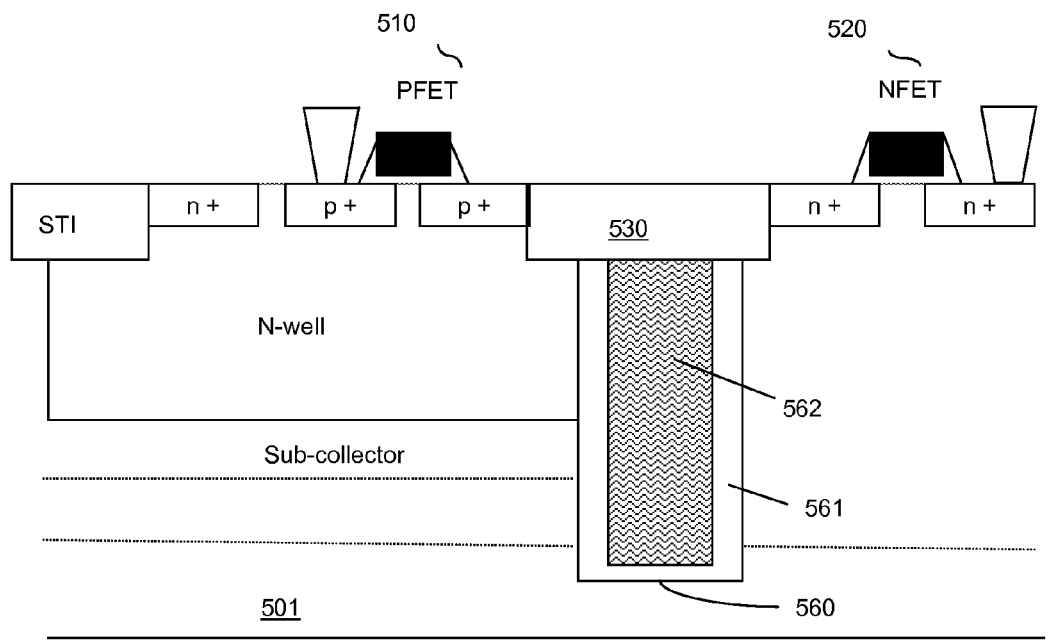
FIG. 5 is a schematic block diagram illustrating a cross-sectional view of a static random access memory cell (SRAM) cell incorporating a deep trench (DT) isolation structure.

FIG. 5 illustrates a six-transistor SRAM cell 500, similar to SRAM cell 100 described above. However, in addition to the isolation structure 530 separating the devices 510, 520, a deep trench isolation (DTI) structure 560 is positioned within the device 500 and extends from the isolation structure 530 into the substrate 501 to isolate sub-collector that is used to reduce vertical pnp gain (if applicable) and to eliminate lateral devices in order to improve latchup robustness to reduce npn bipolar parasitic gain. Specifically, this DTI structure 560 comprises a trench that is lined with a dielectric material 561 (e.g., an oxide, a nitride, or other insulating material) and filled with a semiconductor fill material 562(e.g., polysilicon). A polysilicon fill 562 is used rather than an oxide or other dielectric fill material in order to avoid cracking during subsequent processing or device use. However, because this polysilicon fill material 562 is completely isolated by the STI structure 530 and the dielectric material 561, it serves no other function.

Figure 6:
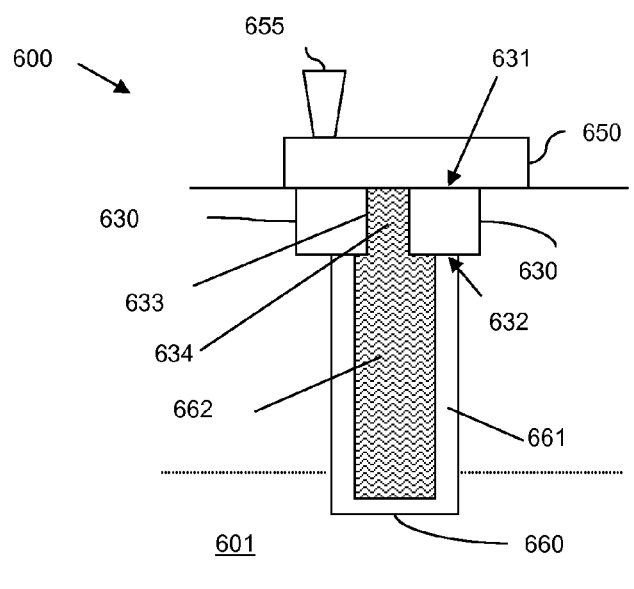
FIG. 6 is a schematic block diagram illustrating a cross-sectional view of an exemplary deep trench capacitor structure of another embodiment of the invention.

FIG. 6 illustrates another embodiment of the integrated circuit structure of the invention that comprises a deep trench capacitor 600 that incorporates a silicon germanium film 650 as an electrical contact. This capacitor 600 comprises an isolation structure 630 (e.g., a shallow trench isolation (STI) structure (as illustrated), a recessed oxide isolation (ROX) structure, a local oxidiation of silicon structure (LOCOS), etc.). This isolation structure 630 has a first side 631 and a second side 632. The silicon germanium film 650 is positioned adjacent to the first side 631 of the isolation structure 630 (i.e., above the isolation structure) and a deep trench (DT) isolation structure 660 is positioned adjacent to the second side 632 of the isolation structure 630 (i.e., below the isolation structure).

The DT structure 660 comprises a dielectric liner 661 (e.g., an oxide liner, a nitride liner, or any other suitable dielectric liner material) and a first fill material 662. The first fill material 662 can comprise a semiconductive material (e.g., polysilicon, polysilicon germanium, polysilicon germanium carbon, etc.) or a suitable conductive material. A channel 633 extends through the isolation structure 630 from the first side 631 to the second side 632 and comprises a second fill material 634. The second fill material 634 can comprise a second semiconductive or conductive material that is either the same or different than the first fill material 662. This second fill material 634 electrically connects the silicon germanium film 650 to the first fill material 662. The silicon germanium film 650 can be electrically connected to a power supply by an electrode 655. This allows a voltage to be applied to the first fill material 662 and, thus, allows biasing of the capacitor. Such a deep trench capacitor 600 can be incorporated into an SRAM cell similar to that illustrated in FIG. 4 between a n-type pass-gate transistor and a p-type pull-up transistor instead of the DT in order to increase capacitance and, thereby, minimize the soft error rate of the SRAM cell as well as to serve the same functions as the DT.

Furthermore, the silicon germanium film 650 can comprise amorphous or polycrystalline silicon germanium. However, those skilled in the art will recognize that if the fill materials 634 and 662 comprise a single crystalline semiconductor material, then that portion of the silicon germanium film above the channel 633 may also comprise single crystalline silicon germanium. Additionally, due to the methods that may be used to form this film 650 (e.g., ultra-high vacuum chemical vapor deposition), different areas of the silicon germanium film 650 can comprise different concentrations of germanium 454 (see FIGS. 4a-d). For example, as illustrated in FIGS. 4a and 4b the concentration of germanium 454 may be triangular (i.e., greater at the top surface 456 of the film 650 than it is at the bottom surface 457 or vice versa). Alternatively, the concentration of germanium 454 may be trapezoidal or square (i.e., with a greater concentration in the center 458 of the film 650 and a lesser concentration of germanium (as illustrated in FIG. 4c) or no germanium (as illustrated in FIG. 4d) at the top and bottom surfaces 456, 457 of the film 650). Those skilled in the art will recognize that the shapes of the germanium concentrations in the silicon germanium film 650 of FIGS. 4a-d are offered for illustration purposes only and that other shapes are possible and anticipated. The silicon germanium film 650 may also be doped with carbon such that is comprises a silicon germanium carbon film (e.g., to prevent or limit boron diffusion from a p+ diffusion region).

Figure 7:
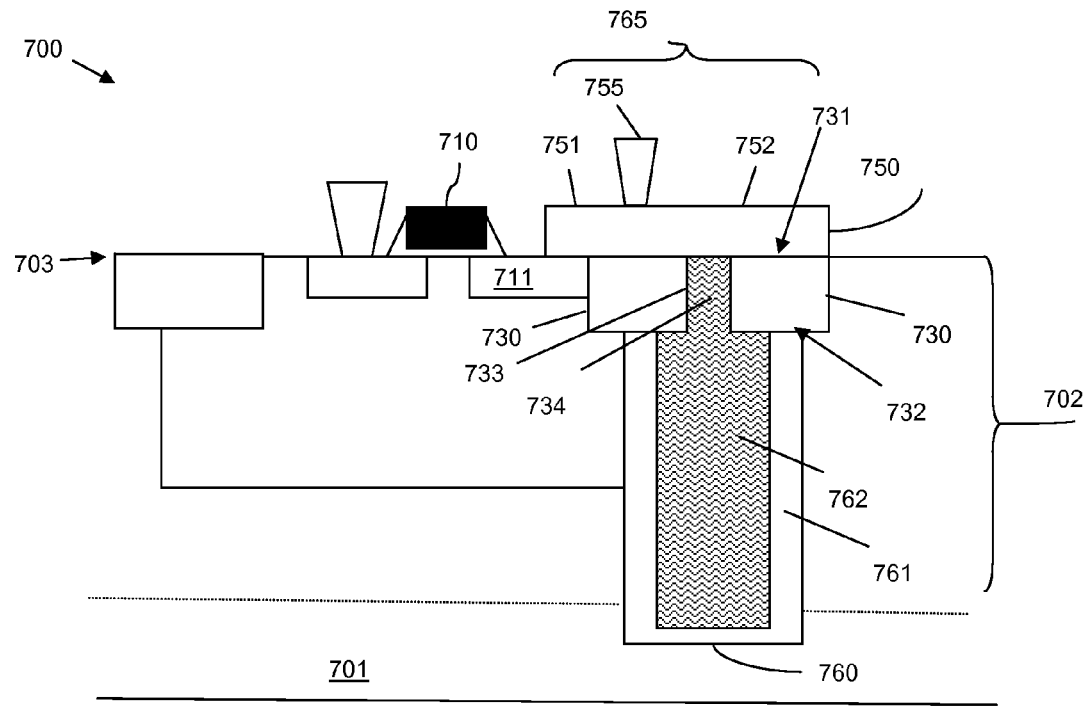
FIG. 7 is a schematic block diagram illustrating a cross-sectional view of an exemplary integrated circuit structure of another embodiment of the invention.

FIG. 7 illustrates another embodiment of the integrated circuit structure 700 of the invention that incorporates a silicon germanium film 750 as both an electrical contact to a deep trench capacitor 760 and as a local interconnect between the deep trench capacitor 760 and another device 710 (e.g., between the deep trench capacitor 760 and the drain 711 of a transistor 710 to form a DRAM cell). Specifically, this integrated circuit structure 700 comprises a substrate 701 and a semiconductor layer 702 (e.g., a single crystalline silicon layer) above the substrate 701. An integrated circuit device 710 (e.g., complementary metal oxide semiconductor device, a transistor, a bipolar transistor, a resistor, a capacitor, a diode, etc.) is formed from the semiconductor layer 702. This device 710 specifically comprises a diffusion region 711 that is within the semiconductor layer 702 and adjacent to the top surface 703 of the semiconductor layer 702. The diffusion region 711 can comprise a single crystalline region that is heavily doped with a first or second conductivity type dopant, depending upon the type of device (e.g., a p+ diffusion region for a pFET or an n+ diffusion region for an nFET).

This integrated circuit structure 700 can further comprise a deep trench capacitor 760 that is similar to the deep trench capacitor described above and illustrated in FIG. 5. the deep trench capacitor 765 is positioned adjacent to the diffusion region 711 within the semiconductor layer 702 and can extend to the substrate 701. The capacitor 765 comprises an isolation structure 730 (e.g., a shallow trench isolation (STI) structure (as shown), a recessed oxide isolation (ROX) structure, a local oxidiation of silicon structure (LOCOS), etc.). The isolation structure 730 has a first side 731 at the top surface 703 of the semiconductor layer 702 and a second (opposing) side 732. A silicon germanium film 750 is positioned adjacent to the first side 731 of the isolation structure 730 (i.e., above the isolation structure) and a deep trench (DT) isolation structure 760 is positioned adjacent to the second side 732 of the isolation structure 730 (i.e., below the isolation structure). The DT structure 760 comprises a dielectric liner 761 (e.g., an oxide liner, a nitride liner or any other suitable dielectric liner material) and a first fill material 762. The first fill material 762 can comprise a semiconductive material (e.g., polysilicon, polysilicon germanium, polysilicon germanium carbon, etc.) or a suitable conductive material (e.g., a semiconductive or conductive material). A channel 733 extends through the isolation structure 730 from the first side 731 to the second side 732 and comprises a second fill material 734. The second fill material 734 can comprise a second semiconductive or conductive material that is either the same or different than the first fill material 762. This second fill material 734 electrically connects the silicon germanium film 750 to the first fill material 762. The silicon germanium film 750 can be electrically connected to a power supply by an electrode 755. This allows a voltage to be applied to the first fill material 762 and, thus, allows biasing of the capacitor 765.

For this integrated circuit structure 700, the silicon germanium film 750 extends further over the diffusion region 711 of the device 710 so as to also electrically connect the diffusion region 711 and thus, the device 710, to the capacitor 765. For example, if the device 710 comprises a transistor and this diffusion region 711 comprises a drain region of the transistor, then the silicon germanium film 760 connects the two devices 711, 765 (transistor and capacitor) such that the integrated circuit structure 700 comprises a dynamic random access memory (SRAM) cell.

Furthermore, a first portion 751 of the silicon germanium film that is located above the diffusion region 711 comprises single crystalline silicon germanium. A second portion 752 of the silicon germanium film above the isolation structure 730 comprises amorphous or polycrystalline silicon germanium. However, those skilled in the art will recognize that if the fill materials 734 and 762 comprise a single crystalline semiconductor material, then that portion of the silicon germanium film 750 above the channel 733 may also comprise single crystalline silicon germanium. Referring to FIGS. 3a-b, depending upon the processing and etching used to shape the upper corner 392 of the isolation structure 730 at the triple point intersections between the diffusion region 711, the silicon germanium film 750 and the isolation structure 730, the silicon germanium film 750 can be formed such that the boundary 390 (i.e., the facet, transitional area, etc.) between the first portion 751 and the second portion 752 projects from the upper corner 392 of the isolation structure 730 at a predetermined angle 391 (e.g., from a 45, as illustrated in FIG. 3a, to a 135 degree angle, as illustrated in FIG. 3b) from the top surface 703 of the semiconductor layer 702. Additionally, due to the methods that may be used to form this film (e.g., ultra-high vacuum chemical vapor deposition), different areas of the silicon germanium film 750 can comprise different concentrations of germanium 454 (see FIGS. 4a-d). For example, as illustrated in FIGS. 4a and 4b the concentration of germanium 454 may be triangular (i.e., greater at the top surface 456 of the film 250 than it is at the bottom surface 457 or vice versa). Alternatively, the concentration of germanium 454 may be trapezoidal or square (i.e., with a greater concentration in the center 458 of the film 750 and a lesser concentration of germanium (as illustrated in FIG. 4c) or no germanium (as illustrated in FIG. 4d) at the top and bottom surfaces 456, 457 of the film 750). Those skilled in the art will recognize that the shapes of the germanium concentrations in the silicon germanium film 750 of FIGS. 4a-d are offered for illustration purposes only and that other shapes are possible and anticipated. The silicon germanium film 750 may also be doped with carbon such that is comprises a silicon germanium carbon film (e.g., to prevent or limit boron diffusion from a p+ diffusion region).

Figure 8:
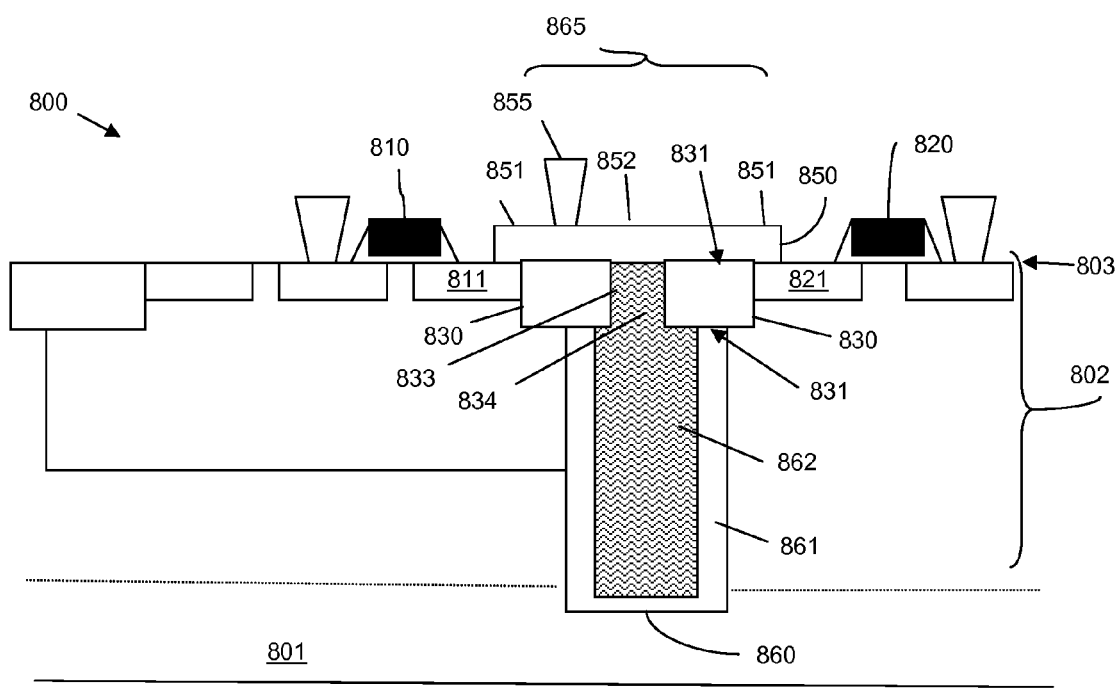
FIG. 8 is a schematic block diagram illustrating a cross-sectional view of an exemplary integrated circuit structure of another embodiment of the invention.

Lastly, FIG. 8 illustrates another embodiment of the integrated circuit structure 800 of the invention that incorporates a silicon germanium film 850 as both an electrical contact to a deep trench capacitor 865 and as a local interconnect between the deep trench capacitor 865 and other devices (e.g., between the deep trench capacitor and multiple transistors in an SRAM cell). Specifically, this integrated circuit structure 800 comprises a substrate 801 and a semiconductor layer 802 (e.g., a single crystalline silicon layer) above the substrate 801. Integrated circuit devices (e.g., a first device 810 and a second device 820) are formed from the semiconductor layer 802. These devices 810, 820 can be the same or different types of devices and can include devices such as, complementary metal oxide semiconductor devices, transistors, bipolar transistors, resistors, capacitors, diodes, etc. For example, the first and second devices can comprise a p-type pull-up field effect transistor (pull-up pFET) and an n-type pass-gate field effect transistor (pass-gate nFET), respectively, of one node of a six transistor static random access memory cell (6T SRAM cell). Regardless of the type of device, the first device 810 comprises a first diffusion region 811 within the semiconductor layer 802 and positioned at the top surface 803 of the semiconductor layer 802. The first diffusion region 811 can comprise a single crystalline region that is heavily doped with a first conductivity type dopant (e.g., a p+ diffusion region). Similarly, the second device 820 comprises a second diffusion region 821 within the semiconductor layer 801 and positioned at the top surface 803 of the semiconductor layer 802. The second diffusion region 821 can comprise a single crystalline region that is heavily doped with a second conductivity type dopant (e.g., an n+ diffusion region).

This integrated circuit structure 800 can further comprise a deep trench capacitor 865 that is similar to the deep trench capacitor 765 described above. This deep trench capacitor 865 can be positioned between the first diffusion region 811 and the second diffusion region 821. The capacitor 865 comprises an isolation structure 830 (e.g., a shallow trench isolation (STI) structure, a recessed oxide isolation (ROX) structure, a local oxidiation of silicon structure (LOCOS), etc.). The isolation structure 830 has a first side 831 at the top surface 803 of the semiconductor layer 802 and a second (opposing) side 832. A silicon germanium film 850 is positioned adjacent to the first side 831 of the isolation structure 830 (i.e., above the isolation structure) and a deep trench isolation (DTI) structure 860 is positioned adjacent to the second side 832 of the isolation structure 830 (i.e., below the isolation structure). The DTI structure 860 comprises a dielectric liner 861 (e.g., an oxide liner, a nitride liner or any other suitable dielectric liner material) and a first fill material 862. The first fill material 862 can comprise a semiconductive material (e.g., polysilicon, polysilicon germanium, polysilicon germanium carbon, etc.) or a suitable conductive material (e.g., a semiconductive or conductive material). A channel 833 extends through the isolation structure 630 from the first side 831 to the second side 832 and comprises a second fill material 834. The second fill material 834 can comprise a second semiconductive or conductive material that is either the same or different than the first fill material 862. This second fill material 834 electrically connects the silicon germanium film 850 to the first fill material 862. The silicon germanium film 850 can be electrically connected to a power supply by an electrode 855. This allows a voltage to be applied to the first fill material 862 and, thus, allows biasing of the capacitor 865.

For this integrated circuit structure 800, the silicon germanium film 850 further extends over from over the first diffusion region 811 across the isolation structure 830 of the capacitor 865 to over the second diffusion region 821 so as to electrically connect the first diffusion region 811 (and thus, the first device 810), the capacitor 865 and the second diffusion region 821 (and thus, the second device 820).

Furthermore, first portions 851 of the silicon germanium film that are located above the first and second diffusion regions 811, 821 comprise single crystalline silicon germanium. A second portion 852 of the silicon germanium film above the isolation structure 830 comprises amorphous or polycrystalline silicon germanium. However, those skilled in the art will recognize that if the fill materials 834 and 862 comprise a single crystalline semiconductor material, then that portion of the silicon germanium film 850 above the channel 833 may also comprise single crystalline silicon germanium. Referring to FIGS. 3a-b, depending upon the processing and etching used to shape the upper corners 392 of the isolation structure 830 at the triple point intersections between the diffusion regions 811, 821, the silicon germanium film 850 and the isolation structure 830, the silicon germanium film 850 can be formed such that the boundaries 390 (i.e., the facets, transitional areas, etc.) between the first portions 851 and the second portion 852 project from the upper corners 392 of the isolation structure 830 at a predetermined angle 391 (e.g., from a 45, as illustrated in FIG. 3a, to a 135 degree angle, as illustrated in FIG. 3b) from the top surface 803 of the semiconductor layer 802. Additionally, due to the methods that may be used to form this film 850 (e.g., ultra-high vacuum chemical vapor deposition), different areas of the silicon germanium film 850 can comprise different concentrations of germanium 454 (see FIGS. 4a-d). For example, as illustrated in FIGS. 4a and 4b the concentration of germanium 454 may be triangular (i.e., greater at the top surface 456 of the film 850 than it is at the bottom surface 457 or vice versa). Alternatively, the concentration of germanium 454 may be trapezoidal or square (i.e., with a greater concentration in the center 458 of the film 850 and a lesser concentration of germanium (as illustrated in FIG. 4c) or no germanium (as illustrated in FIG. 4d) at the top and bottom surfaces 456, 457 of the film 850). Those skilled in the art will recognize that the shapes of the germanium concentrations in the silicon germanium film 850 of FIGS. 4a-d are offered for illustration purposes only and that other shapes are possible and anticipated. The silicon germanium film 850 may also be doped with carbon such that is comprises a silicon germanium carbon film (e.g., to prevent or limit boron diffusion from a p+ diffusion region to an n+ diffusion region).

Figure 9:
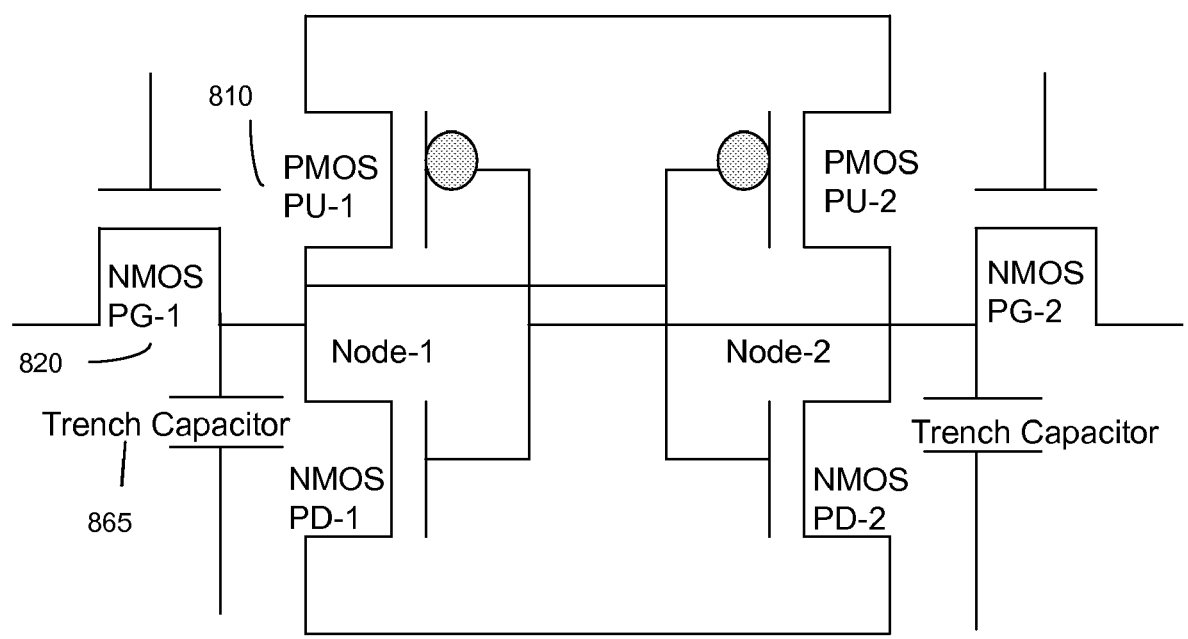
FIG. 9 is a schematic circuit diagram illustrating the exemplary integrated circuit structure of FIG. 8.

FIG. 9 is a schematic circuit diagram of the integrated circuit structure 800 of FIG. 8, if the first device 810 is a p-type pull-up transistor of a static random access memory cell and the second device 820 is an n-type pass-gate transistor of the same node in the same static random access memory cell. Referring to FIGS. 8 and 9 in combination, by applying a voltage to the silicon germanium film 850 (e.g., via the electrode 855) the capacitor 865 between the transistors 810, 820 can be biased. Such a deep trench capacitor can be incorporated into an SRAM cell and used to minimize the soft error rate associated with the SRAM cell by increasing capacitance without significantly altering cell surface area or power requirements. As with the DT structure in the SRAM of FIG. 4 and further illustrated in the patent application of Voldman et al. (incorporated herein by reference), this deep trench capacitor can incorporated into double or triple well structures, can be used to isolate sub-collector regions of an nFETs to reduce vertical pnp gain and minimize carrier injection and can also be used to eliminate lateral devices to improve latchup robustness. More specifically, this contacted deep trench capacitor can serve as a heat sink for performance improvement and can further be biased to increase collector-to-substrate breakdown (e.g., from 40-55 volts), improve latchup robustness, and alter capacitance coupling to the substrate in order to influence $f_{MAX}$ performance.

Therefore, disclosed above are integrated circuit structures each having a silicon germanium film incorporated as a local interconnect and/or an electrical contact. For example, such silicon germanium films are suitable for incorporation into CMOS technology, Bipolar technology, Bipolar/CMOS (BiCMOS) technology, bulk CMOS technology, partially depleted silicon on insulator (PD-SOI) technology, fully depleted SOI (FD-SOI) technology, ultra-thin silicon on insulator (UT-SOI) technology, and radio frequency (RF) technologies, as well as into both single gate and dual gate SOI technologies. Such films are also suitable for incorporation into advanced three-dimensional semiconductor devices such as fin-type field effect transistors (FinFETs), multi-finger FETs (MuGFETs), McFETs, and other advanced geometrical extensions of the standard two dimensional MOSFET or bipolar devices. Additionally, such films are suitable for incorporation into micro-mechanical devices (MEMs), micro-machines, and other integrated electronic devices.

The exemplary embodiments of the integrated circuit structures disclosed above provide improved local interconnects between devices and/or increased capacitance to devices without significantly increasing structure surface area or power requirements. Specifically, disclosed are integrated circuit structures that incorporate a silicon germanium film as one or more of the following features: as a local interconnect between devices; as an electrical contact to a device (e.g., a deep trench capacitor contact, a substrate contact, an n-well contact, a p-well contract, a triple well region contact, a p+ diffusion contact, a n+ diffusion contact, a MOSFET gate contact, a bipolar transistor contact for an emitter, base or collector region, etc.); as both an electrical contact to a deep trench capacitor and a local interconnect between the deep trench capacitor and another device; and as both an electrical contact to a deep trench capacitor and as a local interconnect between the deep trench capacitor and other devices. Furthermore, in strained silicon MOSFET devices, such silicon germanium films can serve as an electrical contact and simultaneously provide mechanical strain (e.g., either tensile or compressive strain) in the structure that it is electrically connected to in order to provide modified device characteristics.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of exemplary embodiments, those skilled in the art will recognize that the invention can be practiced with modification within the spirit and scope of the appended claims.

What is claimed is:

1. An integrated circuit structure comprising:
    a substrate;
    a semiconductor layer above said substrate and having a first top surface;
    a first device comprising a first diffusion region within said semiconductor layer at said first top surface;
    a second device comprising a second diffusion region within said semiconductor layer at said first top surface;
    an isolation structure between said first diffusion region and said second diffusion region, said isolation structure having a second top surface approximately level with said first top surface; and
    an interconnect structure comprising a silicon germanium film, said silicon germanium film being rectangular in shape and having a center portion on said second top surface only of said isolation structure and end portions extending laterally beyond said second top surface onto said first top surface such that said end portions contact said first diffusion region and said second diffusion region, said interconnect structure electrically connecting said first diffusion region to said second diffusion region,
    wherein said end portions of said silicon germanium film above said first diffusion region and said second diffusion region comprise single crystalline silicon germanium,
    wherein said center portion of said silicon germanium film above said isolation structure comprises one of amorphous silicon germanium and polycrystalline silicon germanium,
    wherein boundaries between said end portions and said center portion project from upper corners of said isolation structure at a predetermined angle,
    wherein said silicon germanium film further has a lower portion in contact with said first diffusion region, said isolation structure and said second diffusion region, and a middle portion above said lower portion and an upper portion above said middle portion, and
    wherein said silicon germanium film further comprises germanium in different predetermined concentrations in at least two of said lower portion, said middle portion and said upper portion.

2. The integrated circuit structure of claim 1, said isolation structure having upper corners with a predetermined shape such that said predetermined angle is less than 90 degrees.

3. The integrated circuit structure of claim 1, wherein said germanium increases in concentration between said lower portion and said upper portion.

4. The integrated circuit structure of claim 1, wherein said silicon germanium film comprises a silicon germanium carbon film preventing dopant diffusion between said first diffusion region and said second diffusion region.

5. The integrated circuit structure of claim 1, wherein said first device and said second device each comprises one of a complementary metal oxide semiconductor device, a transistor, a bipolar transistor, a resistor, a capacitor, and a diode.

6. An integrated circuit structure comprising:
a substrate;
a semiconductor layer above said substrate and having a first top surface;
a first device comprising a p+ diffusion region within said semiconductor layer at said first top surface;
a second device comprising an n+ diffusion region within said semiconductor layer at said first top surface;
an isolation structure between said p+ diffusion region and said n+ diffusion region, said isolation structure having a second top surface approximately level with said first top surface; and
an interconnect structure comprising a silicon germanium film, said silicon germanium film being rectangular in shape and having a center portion on said second top surface only of said isolation structure and end portions extending laterally beyond said second top surface onto said first top surface such that said end portions contact said n+ diffusion region and said p+ diffusion region, said interconnect structure electrically connecting said p+ diffusion region to said n+ diffusion region, said silicon germanium film further comprising a silicon germanium carbon film preventing boron diffusion from said p+ diffusion region to said n+ diffusion region,
wherein said end portions of said silicon germanium film above said p+ diffusion region and said n+ diffusion region comprise single crystalline silicon germanium,
wherein said center portion of said silicon germanium film above said isolation structure comprises one of amorphous silicon germanium and polycrystalline silicon germanium,
wherein boundaries between said end portions and said center portion project from upper corners of said isolation structure at a predetermined angle, and
wherein said silicon germanium film further has a lower portion in contact with said p+ diffusion region, said isolation structure and said n+ diffusion region, and a middle portion above said lower portion and an upper portion above said middle portion, and wherein said silicon germanium film further comprises germanium in different predetermined concentrations in at least two of said lower portion, said middle portion and said upper portion.

7. The integrated circuit structure of claim 6, said isolation structure having upper corners with a predetermined shape such that said predetermined angle is one of less than 90 degrees and greater than 90 degrees.

8. The integrated circuit structure of claim 6, wherein said germanium increases in concentration between said lower portion and said upper portion.

9. The integrated circuit structure of claim 6, wherein said first device and said second device each comprises one of a complementary metal oxide semiconductor device, a transistor, a bipolar transistor, a resistor, a capacitor, and a diode.

* * * * *